(12) United States Patent
Itoh et al.

(10) Patent No.: US 8,686,480 B2
(45) Date of Patent: Apr. 1, 2014

(54) SEMICONDUCTOR DEVICE AND METHOD FOR MANUFACTURING SAME

(75) Inventors: Tsuyoshi Itoh, Osaka (JP); Hiroshi Nakatsuji, Osaka (JP); Masahiro Fujiwara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/641,442

(22) PCT Filed: Apr. 6, 2011

(86) PCT No.: PCT/JP2011/058676
§ 371 (c)(1),
(2), (4) Date: Nov. 2, 2012

(87) PCT Pub. No.: WO2011/129234
PCT Pub. Date: Oct. 20, 2011

(65) Prior Publication Data
US 2013/0099290 A1    Apr. 25, 2013

(30) Foreign Application Priority Data

Apr. 16, 2010  (JP) ................................. 2010-095314

(51) Int. Cl.
*H01L 27/148*     (2006.01)
(52) U.S. Cl.
USPC ...... 257/225; 257/233; 257/292; 257/E27.133
(58) Field of Classification Search
USPC ............................ 257/225, 233, 292, E27.133
See application file for complete search history.

(56) References Cited

U.S. PATENT DOCUMENTS

| | | | |
|---|---|---|---|
| 2008/0164473 | A1 | 7/2008 | Tai et al. |
| 2009/0141224 | A1* | 6/2009 | Ito et al. ........................ 349/116 |
| 2009/0152563 | A1* | 6/2009 | Hayashi et al. ................. 257/72 |
| 2011/0049588 | A1 | 3/2011 | Isobe et al. |

FOREIGN PATENT DOCUMENTS

| | | |
|---|---|---|
| JP | 1988-134557 U | 9/1988 |
| JP | 8-330559 A | 12/1996 |
| JP | 2008-171871 A | 7/2008 |
| JP | 2008-287061 A | 11/2008 |
| JP | 2008-300630 A | 12/2008 |
| JP | 2009-135188 A | 6/2009 |
| JP | 2011-071491 A | 4/2011 |

OTHER PUBLICATIONS

International Search Report (ISR) issued in PCT/JP2011/058676 mailed in Jun. 2011.

* cited by examiner

*Primary Examiner* — Timor Karimy
(74) *Attorney, Agent, or Firm* — Chen Yoshimura LLP

(57) ABSTRACT

Disclosed is a method for manufacturing a semiconductor device that can improve the performance of a photodiode that is formed on a same substrate as a thin film transistor without greatly deteriorating the productivity of the semiconductor device. On a glass substrate 30, a base layer 31 having a recess 33b on the surface is formed, and on the base layer 31, an amorphous silicon thin film 42 is formed. The amorphous silicon thin film 42 is melted to form a crystalline silicon thin film 43, while moving the molten silicon into the recess 33b. Of the silicon thin film 43, a silicon film 11 that constitutes a portion of a thin film transistor 10 is formed of the silicon thin film 43 in a part other than the recess 33b, while a silicon film 21 that constitutes a portion of a photodiode 20 is formed of the silicon thin film 43 in the recess 33b.

4 Claims, 7 Drawing Sheets

(a)

(b)

(c)

(d)

(e)

(a)

(b)

(c)

(d)

(a)

(b)

(c)

(d)

(a)

(b)

(c)

(d)

(e)

SEMICONDUCTOR DEVICE AND METHOD FOR MANUFACTURING SAME

TECHNICAL FIELD

The present invention relates to a semiconductor device in which photodiodes and thin film transistors are formed on the same substrate, and a method for manufacturing same.

BACKGROUND ART

A semiconductor device in which photodiodes and thin film transistors are formed on the same substrate has been known since before. In such a semiconductor device, the thin film transistors are constituted of some of semiconductor layers out of a plurality of island shaped semiconductor layers formed on the substrate, and the photodiodes are constituted of the remaining semiconductor layers that respectively have light-shielding layers provided between the semiconductor layers and the substrate, as disclosed in Japanese Patent Application Laid-Open Publication No. 2008-300630, for example.

SUMMARY OF THE INVENTION

However, when providing photodiodes and thin film transistors on the same substrate as in the configuration disclosed in Japanese Patent Application Laid-Open Publication No. 2008-300630, if the semiconductor layers of the photodiode and the thin film transistor are formed simultaneously, the thicknesses of the respective semiconductor layers are equal.

When using the photodiode as a sensor, the sensitivity thereof depends greatly on the thickness of the semiconductor layer, and therefore, it is preferable that the semiconductor layer of the photodiode be thick. On the other hand, if the semiconductor layer of the thin film transistor is made thick, this greatly affects the characteristics of the thin film transistor, and therefore, it is preferable that the thickness of the semiconductor layer not be changed greatly. In other words, in order to improve the performance of the photodiodes without reducing the performance of the thin film transistors, it is necessary to make only the semiconductor layers of the photodiodes thick.

In order to fulfill this requirement, there is a method in which film-forming and etching are conducted a plurality of times when forming the semiconductor layers such that the semiconductor layers of the photodiodes are made thicker. However, this would greatly increase the number of process steps, thus greatly reducing the productivity of the semiconductor device.

An object of the present invention is to improve the performance of photodiodes formed on the same substrate with thin film transistors, without greatly diminishing the productivity of the semiconductor device.

A method for manufacturing a semiconductor device according to one embodiment of the present invention includes: a step of forming a base layer in which a base layer having a recess on the surface is formed on a substrate; a step of forming a silicon layer in which an amorphous silicon layer is formed on the base layer; a melting step in which a crystalline silicon layer is formed by melting the amorphous silicon layer and moving the molten silicon into the recess; and a step of forming semiconductor layers in which, of the crystalline silicon layer, a first semiconductor layer that constitutes a portion of a thin film transistor is formed of the silicon layer located in a part other than the recess, and in which a second semiconductor layer that constitutes a portion of a photodiode is formed of the silicon layer located in the recess.

According to the present invention, the performance of the photodiodes formed with the thin film transistors on the same substrate can be improved without greatly affecting the productivity of the semiconductor device.

DETAILED DESCRIPTION OF EMBODIMENTS

Figure 1:
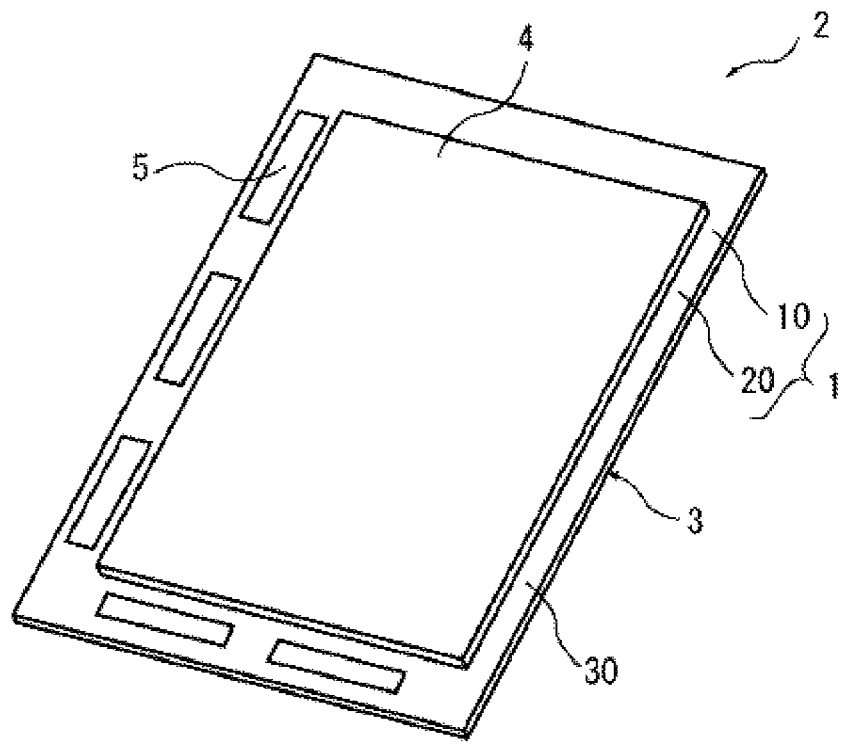
FIG. 1 is a perspective view that shows a schematic configuration of a display panel of a liquid crystal display device provided with a semiconductor device according to Embodiment 1.

A method for manufacturing a semiconductor device according to one embodiment of the present invention includes: a base layer forming step of forming a base layer on a substrate, the base layer having a recess on a surface thereof; a silicon layer forming step of forming an amorphous silicon layer on the base layer; a melting step of melting the amorphous silicon layer to form a crystalline silicon layer while moving molten silicon into the recess; and a semiconductor layer forming step of forming, of the crystalline silicon layer, a first semiconductor layer that constitutes a portion of a thin film transistor and the second semiconductor layer that constitutes a portion of a photodiode, the first semiconductor layer being formed of the silicon layer located in a part other than the recess, the second semiconductor layer being formed of the silicon layer located in the recess (first method).

With the above-mentioned method, it is possible to make the second semiconductor layer that constitutes a portion of the photodiode thicker than the first semiconductor layer that constitutes a portion of the thin film transistor, in a configuration in which the thin film transistor and the photodiode are formed on the same substrate. In other words, by forming a base layer having a recess on the substrate and melting the silicon layer formed on the base layer, the molten silicon layer can be moved into the recess, and a semiconductor layer that is thicker than in any other part can be formed in the recess.

Therefore, through the above method, it is possible for the thin film transistor and the photodiode to have semiconductor layers with different thicknesses without conducting film-forming or etching a plurality of times. As a result, it is possible to improve with ease the performance of the photodiodes formed together with the thin film transistors on the same substrate.

In the aforementioned first method, it is preferable that a step of forming an island shaped light-shielding layer on the substrate be further included, wherein in the base layer forming step, the base layer is formed on the substrate and the light-shielding layer such that the recess is located above the light-shielding layer (second method).

Through this method, it is possible to form a recess corresponding to the light-shielding layer on the surface of the base layer. Here, when using the photodiode as a light sensor of the display device, a light-shielding layer is necessary in order to prevent light from a backlight device from entering the photodiode. Therefore, in the above-mentioned base layer forming step, it is possible to form a recess in an area of the base layer where the photodiode, which is provided with a light-shielding layer, is formed. Thus, it is possible to make the semiconductor layer of the photodiode formed in the recess thicker than the semiconductor layer of the thin film transistor.

In the second method, it is preferable that the substrate be a transparent substrate, and that the base layer forming step include: a base layer depositing step of forming the base layer on the substrate and the light-shielding layer; a pattern forming step of radiating light from a side opposite to a laminating direction of the substrate, using the light-shielding layer as a mask, to form a resist pattern on the base layer formed in the base layer depositing step; and a recess forming step of removing at least a portion of the base layer on the light-shielding layer, with the resist pattern as a mask, to form the recess (third method).

This way, it is possible to form a resist pattern using the light-shielding layer as a mask, and therefore, it is possible to form with ease a resist pattern that exposes the base film located above the light-shielding layer. Therefore, it is possible to form with ease a recess corresponding to the light-shielding layer on the base layer.

In the second method, it is preferable that the substrate be a transparent substrate, that the base layer include a plurality of base films, and that the base layer forming step include: a base layer depositing step of forming a first base film that is thicker than the light-shielding layer on the substrate and the light-shielding layer; a pattern forming step of radiating light from a side opposite to a laminating direction of the substrate, using the light-shielding layer as a mask, to form a resist pattern on the first base film; and a recess forming step of removing the first base film on the light-shielding layer using the resist pattern as a mask, and thereafter forming a second base film on the light-shielding layer and the first base film to form the recess on the second base film (fourth method).

Through this method, a silicon layer can be formed continuously on the second base film, preventing dust or the like from bonding onto the second base film. Therefore, it is possible to prevent defects from occurring in the semiconductor device.

In the first method, it is preferable that the base layer include a plurality of base films, and that the base layer forming step include: a first base film forming step of forming a first base film and a light-shielding layer that is thinner than the first base film on the substrate; and a second base film forming step of forming another base film on the first base film and the light-shielding layer to form the recess corresponding to the light-shielding layer (fifth method).

An effect similar to the fourth method can also be attained with this method.

A semiconductor device according to one embodiment of the present invention includes: a substrate; a base layer formed on the substrate so as to have a recess on the surface; a first semiconductor layer formed outside the recess of the base layer; and a second semiconductor layer formed in the recess so as to be thicker than the first semiconductor layer, wherein the first semiconductor layer constitutes a portion of a thin film transistor, and wherein the second semiconductor layer constitutes a portion of a photodiode (sixth configuration).

With this configuration, the second semiconductor layer of the photodiode is thicker than the first semiconductor layer of the thin film transistor, and thus, the performance of the photodiode can be improved. Furthermore, a recess is formed in the base layer, and thus, in the manufacturing process of the semiconductor device, it is easy to attain the above-mentioned configuration in which the second semiconductor layer is made thicker than the first semiconductor layer by melting the silicon layer formed on the base layer.

In the sixth configuration, it is preferable that the first semiconductor layer and the second semiconductor layer be formed so as to have thicknesses such that the surfaces thereof opposite to the substrate are at substantially the same height from the substrate (seventh configuration).

With this configuration, it is possible to make the second semiconductor layer formed in the recess of the base layer thicker than the first semiconductor layer. As a result, the performance of the photodiode constituted of the second semiconductor layer can be improved.

In the sixth or seventh configuration, it is preferable that the semiconductor device further include a light-shielding layer formed on the substrate between the substrate and the second semiconductor layer, wherein the base layer includes a first base film formed so as to surround the light-shielding layer on the substrate, and wherein the light-shielding layer is thinner than the first base film (eighth configuration).

This way, a recess can be formed in the base layer by relying on the difference in thickness between the light-shielding film and the first base film. With this configuration, there is no need to directly process the base layer in order to provide the recess, and thus, dust and the like that would be present during processing can be prevented from bonding to the semiconductor device. As a result, defects in the semiconductor device are minimized.

Preferred embodiments of a semiconductor device of the present invention will be described below with reference to drawings. The dimensions of the components in each of the drawings do not indicate faithfully the actual dimensions of the components, the ratio of the dimensions of the components to each other, or the like.

Embodiment 1

FIG. 1 shows a schematic configuration of a display panel 2 of a liquid crystal display device provided with a semiconductor device 1 according to Embodiment 1. In other words, the semiconductor device 1 according to the present embodiment is used in an active matrix substrate 3 or the like that constitutes the display panel 2 of the liquid crystal display device, for example.

The display panel 2 is provided with the active matrix substrate 3, an opposite substrate 4, and a liquid crystal layer (not shown in drawings) sandwiched therebetween. The display panel 2 is equipped with light sensors provided with photodiodes 20 that output a signal according to external light. The basic configuration of the light sensor is the same as conventional configurations; therefore, detailed descriptions concerning the operation of the light sensor will be omitted. The display panel 2 is illuminated with light from a not-shown backlight device of the liquid crystal display device.

The active matrix substrate 3 is provided with a glass substrate 30 (substrate) on which many pixels are arranged in a matrix. Also, the active matrix substrate 3 is provided with a pixel electrode and a thin film transistor 10 (hereinafter referred to as a TFT) for each pixel. In addition, the active matrix substrate is provided with photodiodes 20. The opposite substrate 4 is provided with an opposite electrode that faces the pixel electrodes and a color filter that has colored layers.

The liquid crystal display device is configured so as to control the liquid crystals in the liquid crystal layer by driving the TFTs 10 of the active matrix substrate 3 according to signals from drivers 5 provided in the active matrix substrate 3, and display a prescribed image in the display panel 2.

Figure 2:
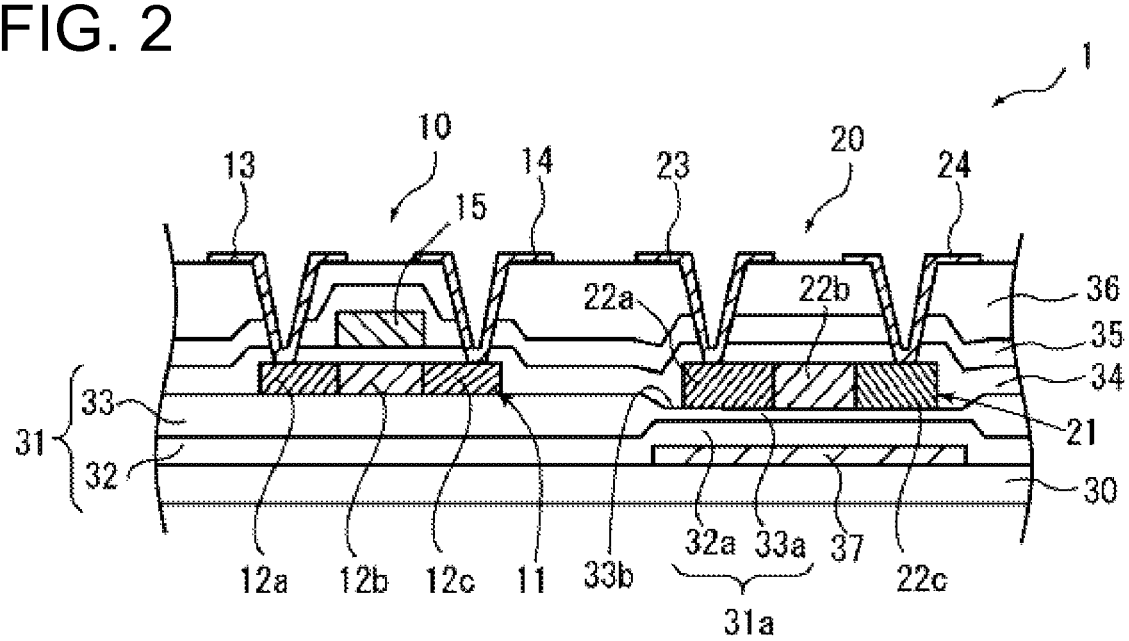
FIG. 2 is a cross-sectional view that shows a schematic configuration of the semiconductor device according to Embodiment 1.

FIG. 2 shows a schematic configuration of the semiconductor device 1 according to the present embodiment. In the semiconductor device 1, TFTs 10 and photodiodes 20 are formed on the same substrate 30. In FIG. 2, only conductors and semiconductors are shown with a hatching pattern. The substrate 30 is a glass substrate that serves as a base substrate for the active matrix substrate 3, for example. The substrate 30 is made of a transparent material.

The TFT 10 is formed on the base layer 31 provided on the substrate 30. The base layer 31 includes a silicon nitride film 32 formed on the substrate 30 and a silicon oxide film 33 formed on the silicon nitride film 32. The TFT 10 has a silicon film 11 (first semiconductor layer) formed on the base layer 31. The silicon film 11 is formed in the same process as a silicon film 21 of the photodiode, as will be described below. A semiconductor region 12a, a channel region 12b, and a semiconductor region 12c are formed in this order in the silicon film 11 along the plane direction thereof.

The semiconductor regions 12a and 12c are respectively connected to wiring lines 13 and 14. In FIG. 2, the reference character 15 represents a gate electrode, the reference character 34 represents a gate insulating film, the reference character 35 represents a silicon nitride film, and the reference character 36 represents a silicon oxide film.

Like the TFT 10, the photodiode 20 is formed on the base layer 31 provided on the substrate 30. Of the base layer 31, a part 31a where the photodiode 20 is formed is provided with a light-shielding film 37 (light-shielding layer) between the substrate 30 and the silicon nitride film 32. The light-shielding film 37 shields illumination light from a backlight device such that the photodiode 20 reacts only to light inputted from one side (the upper side in FIG. 2) of the substrate 30.

Like the TFT 10, the photodiode 20 has a silicon film 21 (second semiconductor layer) formed on the base layer 31a. The base layer 31a, which is the part where the silicon film 21 is located, is formed such that the height of the base layer 31a is less than the part of the base layer 31 where the TFT 10 is formed. Specifically, the silicon oxide film 33a that constitutes the base layer 31a where the photodiode 20 is formed is thinner than the silicon oxide film 33 that constitutes the base layer 31 where the TFT 10 is formed. Thus, a recess 33b is formed on the silicon oxide film 33a. The silicon nitride film 32a of the base layer 31a has the same thickness as the silicon nitride film 32 of the base layer 31.

The silicon film 21 of the photodiode 20 is formed so as to be thicker than the silicon film 11 of the TFT 10. In other words, the silicon film 21 of the photodiode 20 is formed such that the surface thereof opposite to the substrate 30 (upper surface in FIG. 2) is at the same height as the surface of the silicon film 11 of the TFT 10 opposite to the substrate 30 (upper surface in FIG. 2). By making the silicon film 21 of the photodiode 20 thick in this way, the amount of photocurrent generated inside the silicon film 21 according to the external light increases, thus increasing the sensitivity thereof as a sensor.

The silicon film 21 of the photodiode 20 is formed by the same process as the silicon film 11 of the TFT 10. How the silicon films 11 and 21 are formed will be discussed below.

As shown in FIG. 2, the photodiode 20 is a diode that has a lateral structure. Therefore, in the silicon film 21, an n-type semiconductor region 22a, an intrinsic semiconductor region 22b, and a p-type semiconductor region 22c are formed in this order along the plane direction. In FIG. 2, reference characters 23 and 24 represent wiring lines.

Method for Manufacturing Semiconductor Device

Figure 3:
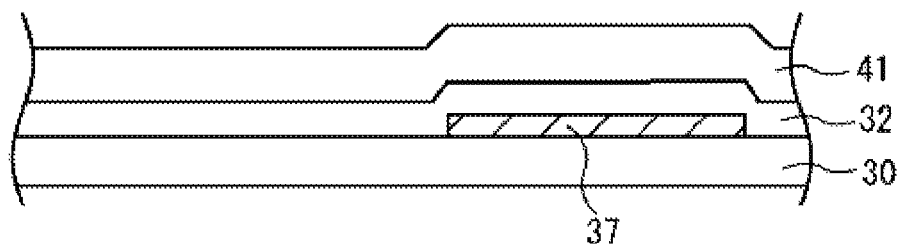
FIG. 3 is a drawing that shows a method for manufacturing the semiconductor device according to Embodiment 1.
Figure 3:
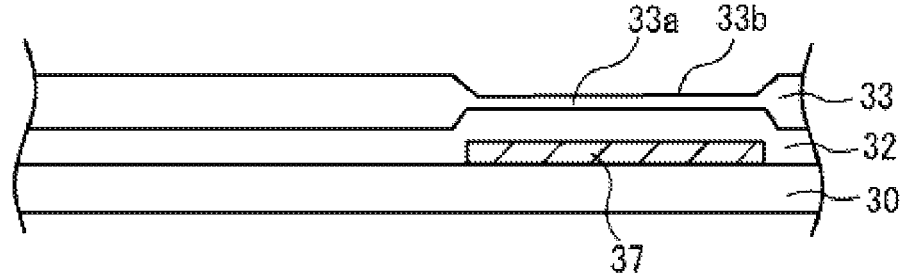
Figure 3:
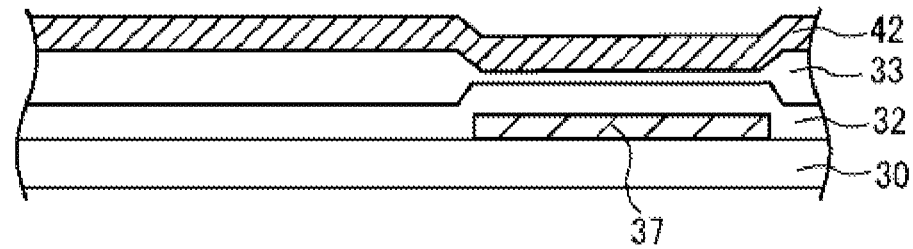
Figure 3:
Figure 3:
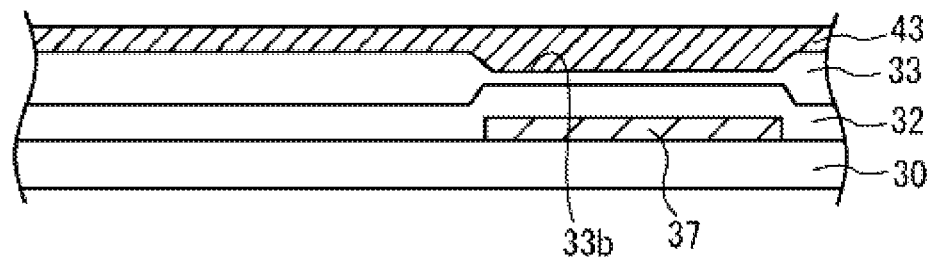
Figure 3:
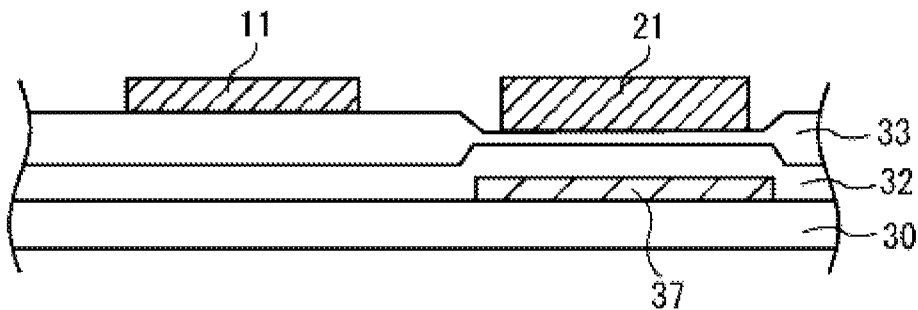
Figure 4:
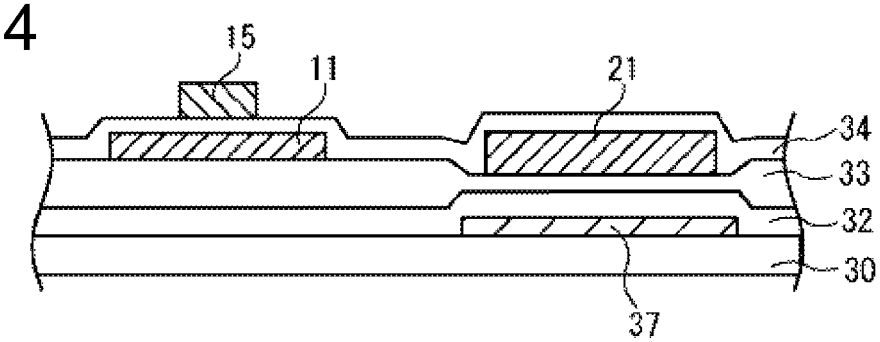
FIG. 4 is a drawing that shows a method for manufacturing the semiconductor device according to Embodiment 1.
Figure 4:
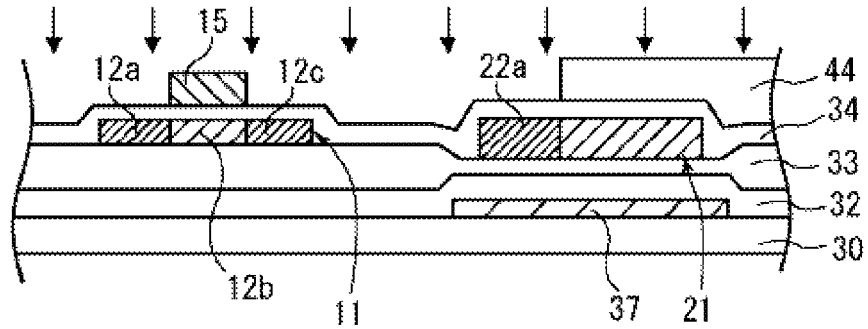
Figure 4:
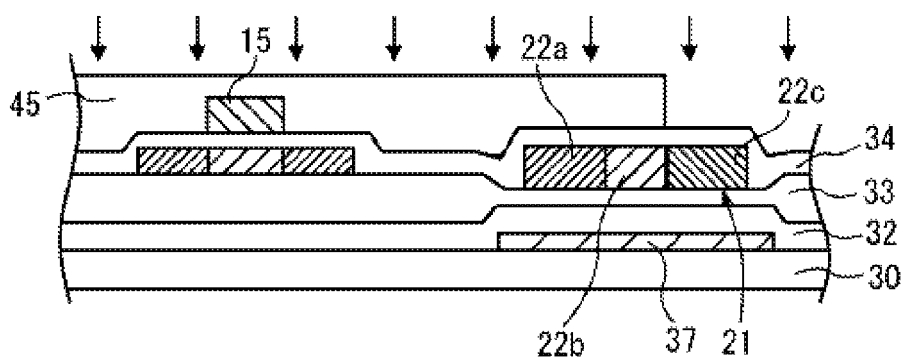
Figure 4:
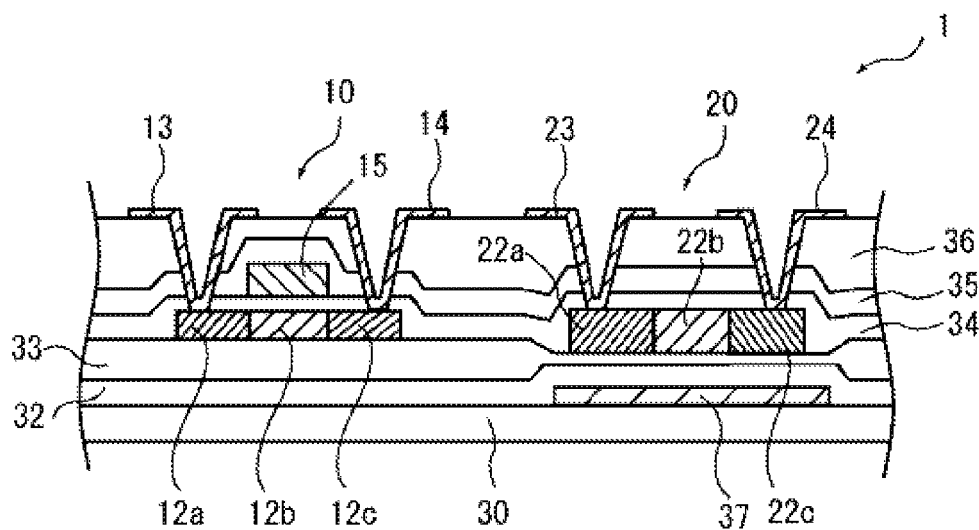

Next, a method for manufacturing the semiconductor device 1 with the above configuration will be described with reference to FIGS. 3 and 4. FIGS. 3 and 4 are cross-sectional drawings that show steps of manufacturing the semiconductor device 1 according to the present embodiment. FIGS. 3a to 3e each show a main manufacturing step up to when the island shaped silicon films 11 and 21 are formed. FIGS. 4a to 4d each show a main manufacturing step conducted after the step shown in FIG. 3e is finished.

First, as shown in FIG. 3a, a light-shielding film 37, which is made to prevent illumination light from a backlight device from entering the photodiode 20 from one side of the substrate 30 (lower side in the drawing), is formed on the substrate 30.

Specifically, a light-shielding thin film is first formed through the CVD (chemical vapor deposition) method, the sputtering method, or the like on one surface (upper surface in the drawing) of the substrate 30. The light-shielding thin film is made of an insulating film such as a silicon oxide film or a silicon nitride film, or a metallic film that has tantalum (Ta), titanium (Ti), tungsten (W), molybdenum (Mo), aluminum (Al) or the like as a main component. After that, through the photolithography method, a resist pattern is formed so as to cover the region where the light-shielding film 37 is to be formed, and the light-shielding thin film is etched using the resist pattern as a mask. As a result, a light-shielding film 37 is formed.

Next, the silicon nitride film 32 is formed so as to cover the substrate 30 and the light-shielding film 37. A silicon oxide film 41 is formed on the silicon nitride film 32. The silicon nitride film 32 and the silicon oxide film 41 are formed through the CVD method, for example. The silicon nitride film 32 and the silicon oxide film 41 may be constituted of one layer or many layers.

Next, through the photolithography method, a resist pattern that has an opening in a region corresponding to the light-shielding film 37 is formed and the silicon oxide film 41 is etched using the resist pattern as a mask, as shown in FIG. 3b. Specifically, a photoresist is coated onto the silicon oxide film 41, and light is radiated from the surface of the substrate 30 opposite to the surface where the light-shielding film 37 is formed (hereinafter referred to as the main surface), thus forming the resist pattern in areas other than the part not exposed to the light as a result of the light-shielding film 37. By conducting etching using the resist pattern, only the part of the silicon oxide film 41 corresponding to the light-shielding film 37 is removed. As a result, a silicon oxide film 33 in which the part 33a corresponding to the light-shielding film 37 is thinner than other parts is formed. Thus, a recess 33b is formed on the surface of the silicon oxide film 33.

Here, as described above, it is preferable that the part of the silicon oxide film 41 corresponding to the light-shielding film 37 not be completely removed, but that the silicon oxide film 41 be etched so as to leave a portion of the silicon oxide film 41 intact. By leaving some of the silicon oxide film intact, heat is prevented from escaping by the silicon oxide film 41 when a silicon thin film 42 is heated by a laser beam 40 as will be described below. Therefore, by leaving the silicon oxide film 41 intact, the crystallization of the silicon can be conducted more efficiently.

After that, the silicon thin film 42 (amorphous silicon layer) is formed on the silicon oxide film 33 as shown in FIG. 3c. The silicon thin film 42 is a thin film made of amorphous silicon. By radiating a laser beam 40 (white arrows) onto the silicon thin film 42, as shown in FIG. 3d, the silicon thin film 42 is melted and changed to a crystalline silicon thin film 43 (crystalline silicon layer). At this time, since the silicon thin film 42 is temporarily melted, some of the molten silicon moves to inside the recess 33b formed on the surface of the silicon oxide film 33. As a result, as shown in FIG. 3d, a silicon thin film 43 in which the silicon thin film inside the recess 33b is thicker than in other parts is formed.

When radiating the laser beam 40 onto the silicon thin film 42, a linear laser beam 40 is formed and sweeps across the silicon thin film 42, with the laser beam focused on the silicon thin film 42. At this time, the entire silicon thin film 42 can be recrystallized evenly by adjusting the intensity distribution of the laser beam 40 so as to be even across the surface.

It is preferable that a solid-state laser oscillator be used as the light source for the laser beam 40. It is also preferable that the wavelength of the laser beam 40 be within the visible spectrum (within a range of 400 nm to 700 nm), which is absorbable with ease by amorphous silicon. Such a wavelength can be attained by using a wavelength-converting element and a solid-state crystal laser oscillator that uses a crystal doped with specific atoms, such as a general solid-state laser including an Nd:YAG laser and an Nd:YVO$_4$ laser, in order to extract a second harmonic or a third harmonic of a fundamental wave.

Next, a resist pattern is formed so as to cover the region where the TFT 10 is to be formed and the region where the photodiode 20 is to be formed in the silicon thin film 43, and the silicon thin film 43 is etched using the resist pattern as a mask. As a result, island shaped silicon films 11 and 21, which constitute the TFT and the photodiode respectively, are formed as shown in FIG. 3e. The silicon film 21 is formed of the silicon thin film 43 formed in the recess 33b of the silicon oxide film 33. As a result, the silicon film 21 is thicker than the silicon film 11.

After that, as shown in FIG. 4a, a gate insulating film 34 is formed so as to cover the silicon films 11 and 21. The gate insulating film 34 is a silicon oxide film or a silicon nitride film formed through the CVD method or the like. The gate insulating film 34 may also be constituted of one layer or a plurality of layers.

After forming the gate insulating film 34, a gate electrode 15 of the TFT 10 is formed above the silicon film 11. Specifically, first, a metallic film having at least one of tantalum (Ta), titanium (Ti), tungsten (W), molybdenum (Mo), aluminum (Al), and the like as a main component is formed on the gate insulating film 34. The metallic film is formed through the sputtering method, the vacuum deposition method, or the like. After that, through the photolithography method, a resist pattern is formed so as to cover the region where the gate electrode 15 is to be formed, and the metallic film is etched using the resist pattern as a mask. As a result, the gate electrode 15 is formed.

Next, as shown in FIG. 4b, n-type impurity ions are implanted in the silicon films 11 and 21, thus forming the semiconductor regions 12a and 12c, and the n-type semiconductor region 22a, respectively. Specifically, first, a resist pattern 44 is formed by photolithography so as to cover a portion of the silicon film 21 from above and leave uncovered the part where the n-type semiconductor region 22a is to be formed. A portion of the silicon film 11 is covered by the gate metal 15 from above such that an intrinsic semiconductor region 12b is formed in the middle portion of the silicon film 11 in the in-plane direction. In this state, ion implantation is conducted using an impurity such as phosphorus (P) (refer to arrows). This results in the semiconductor regions 12a and 12c of the TFT, and the n-type semiconductor region 22a of the photodiode being formed. The resist pattern 44 is removed after ion implantation.

After that, as shown in FIG. 4c, p-type impurity ions are implanted in the silicon film 21, thus forming the p-type semiconductor region 22c. Specifically, first, a resist pattern 45 is formed by photolithography so as to cover regions other than where the p-type semiconductor region 22c is to be formed. In this state, ion implantation using a p-type impurity such as boron (B) is conducted (refer to arrows). This results in a p-type semiconductor region 22c of the photodiode being formed, and an intrinsic semiconductor region 22b being formed between the p-type semiconductor region 22c and the n-type semiconductor region 22a. The resist pattern 45 is removed after ion implantation. After that, a prescribed heat treatment is conducted in order to activate the impurity regions, which are the semiconductor regions 12a and 12c of the TFT, and the n-type semiconductor region 22a and the p-type semiconductor region 22c of the photodiode.

Next, an interlayer insulating film is formed as shown in FIG. 4d. Specifically, after the silicon nitride film 35 is formed, the silicon oxide film 36 is formed. Also, contact holes that reach the semiconductor regions 12a and 12c of the TFT, and the n-type semiconductor region 22a and the p-type semiconductor region 22c of the photodiode are respectively formed in the interlayer insulating film through etching or the like. Electrodes 13, 14, 23, and 24 are formed respectively in the contact holes. As a result, the TFT 10 and the photodiode 20 are formed.

Here, the step of forming the light-shielding film 37 and the base layer 31 on the substrate 30 and the step of forming the recess 33b in the silicon oxide film 33 correspond to the base layer forming step, and the step of forming the silicon thin film 42 on the silicon oxide film 33 corresponds to the silicon layer forming step. The step of melting the silicon thin film 42 by the laser beam 40, moving some of the silicon into the recess 33b, and changing the silicon thin film 42 to the silicon thin film 43 corresponds to the melting step, and the step of forming the silicon films 11 and 21 corresponds to the semiconductor layer forming step.

In addition, the step of forming the silicon nitride film 32 and the silicon oxide film 33 on the substrate 30 and the light-shielding film 37 corresponds to the base layer forming step, and a step of forming the resist pattern on the silicon oxide film 33 corresponds to the pattern forming step. The step of forming the recess 33b in the silicon oxide film 33 through etching, using the resist pattern, corresponds to the recess forming step.

Effects of Embodiment 1

In the present embodiment, a recess 33b is formed in the silicon oxide film 33a, which serves as a base film for the photodiode 20 in a configuration in which the TFT 10 and the photodiode 20 are provided on the same substrate 30. By melting the silicon thin film 42 formed thereon by radiating a laser beam 40 on the silicon thin film 42, the molten silicon is moved into the recess 33b, making the silicon thin film in the recess 33b thicker than in other parts.

According to the above configuration, the silicon film 21 of the photodiode 20 can be made thicker than the silicon film 11 of the TFT 10. As a result, the thickness of only the silicon film 21 of the photodiode 20 can be increased without changing the film thickness or characteristics of the TFT, and thus, the sensitivity of the photodiode 20 can be increased.

Therefore, the manufacturing method of the present embodiment can improve the performance of the photodiode 20 without greatly increasing the number of process steps.

Also, in the present embodiment, when the silicon oxide film 41 formed on the silicon nitride film 32 was etched, a resist pattern was formed on the silicon oxide film 41 by radiating light from the side opposite to the main surface of the substrate 30 using the light-shielding film 37 as a mask. With this configuration, it is possible to etch the region corresponding to the light-shielding film 37 in the silicon oxide film 41 with ease.

Embodiment 2

Figure 5:
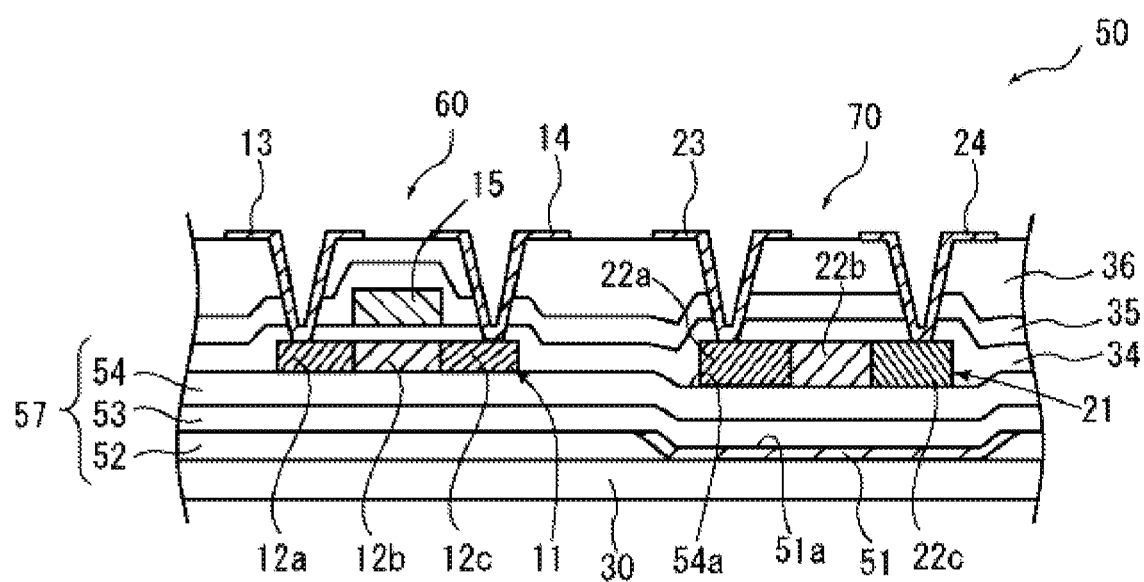
FIG. 5 is a cross-sectional view that shows a schematic configuration of a semiconductor device according to Embodiment 2.

FIG. 5 shows a schematic configuration of a semiconductor device 50 according to Embodiment 2. This embodiment differs from Embodiment 1 in terms of the configuration of a light-shielding film 51 and the method for manufacturing a semiconductor device 50. In the description below, configurations that are the same as those of Embodiment 1 are given the same reference characters, and only parts that are different will be described.

Specifically, in this embodiment, a TFT 60 and a photodiode 70 are formed on the same substrate 30. The light-shielding film 51 (light-shielding layer) on the substrate 30 is formed so as to be thinner than a resin film 52 that surrounds the light-shielding film 51. With this configuration, the light-shielding film 51 has a recess 51a formed against the surrounding resin film 52. A silicon nitride film 53 and a silicon oxide film 54 are formed on the light-shielding film 51 and the resin film 52, and thus, a recess 54a is formed on the surface of the silicon oxide film 54.

Like in Embodiment 1, the silicon film formed on the silicon oxide film 54 is temporarily melted by a laser beam, and thus, the thickness of a silicon film 21 formed inside the recess 54a can be made thicker than a silicon film 11 formed in another part.

A base layer 57 is constituted of the resin film 52, the silicon nitride film 53, and the silicon oxide film 54. The base layer 57 may include one or two of the following: the resin film 52; the silicon nitride film 53; and the silicon oxide film 54. The base layer 57 also may include other thin films.

Method for Manufacturing Semiconductor Device

Figure 6:
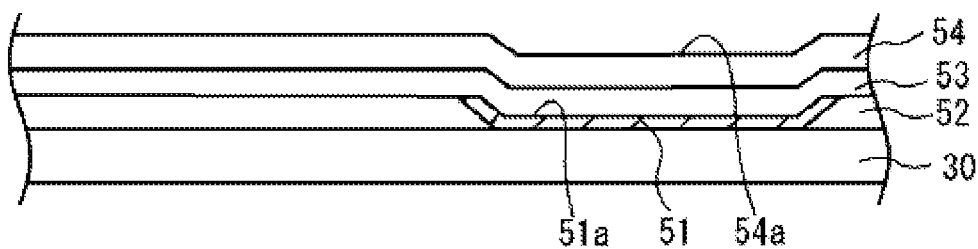
FIG. 6 is a drawing that shows a method for manufacturing the semiconductor device according to Embodiment 2.
Figure 6:
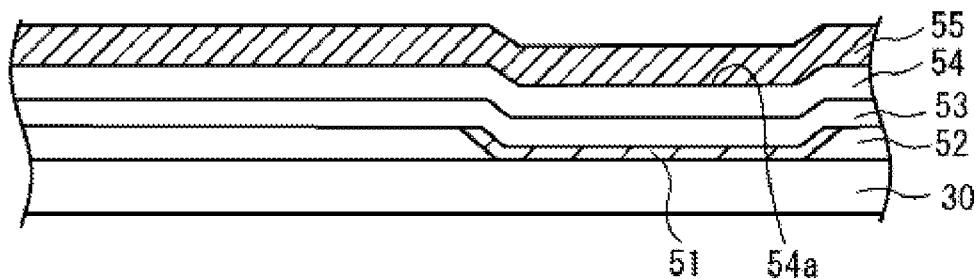
Figure 6:
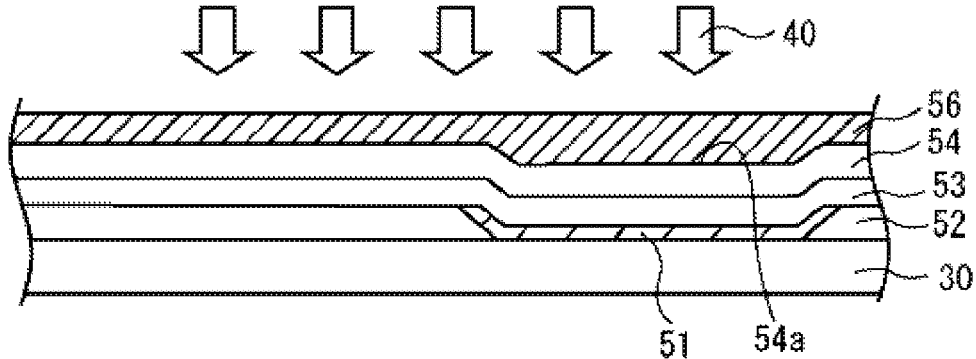
Figure 6:
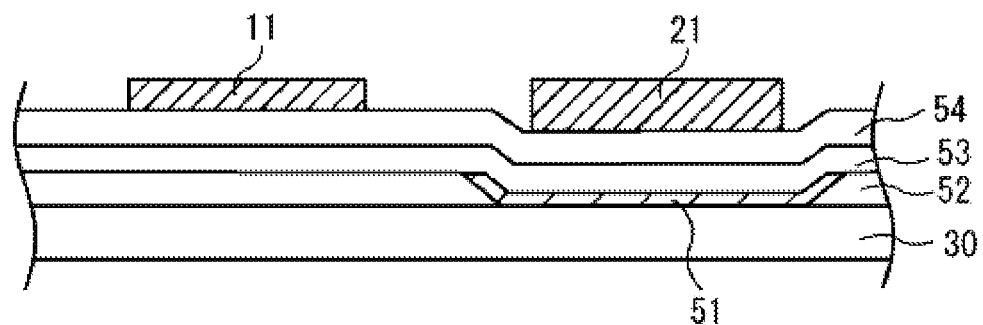

Next, a method for manufacturing the semiconductor device 50 in Embodiment 2 will be described with reference to FIG. 6, only where different from Embodiment 1. FIGS. 6a to 6d show main manufacturing steps up to when the island shaped silicon films 11 and 21 are formed. The steps after FIG. 6d are the same as those of Embodiment 1 shown in FIG. 4, and thus, descriptions thereof are omitted.

First, as shown in FIG. 6a, the light-shielding film 51 for preventing illumination light from a backlight device from entering the photodiode from one side of the substrate 30 (lower side in drawing) is formed on the substrate 30.

Specifically, first, a resin film is formed on one surface of the substrate 30 (upper surface in drawing). The resin film is made of an acrylic resin. After that, through the photolithography method, a resist pattern is formed with an opening where the light-shielding film 51 is to be formed, and using the resist pattern as a mask, the resin film that is in the region where the light-shielding film 51 is to be formed is removed through etching. As a result, the resin film 52 (first base film) is formed on the substrate 30. The method of forming the resin film 52 is not limited thereto; when forming the resin film 52, a mask may be provided such that the resin film is not formed in the region where the light-shielding film 51 is to be formed.

Then, a light-shielding thin film is formed on the substrate 30 and the resin film 52 through the CVD (chemical vapor deposition) method, the sputtering method, or the like. The light-shielding thin film is made of an insulating film such as a silicon oxide film or a silicon nitride film, or a metallic film with tantalum (Ta), titanium (Ti), tungsten (W), molybdenum (Mo), aluminum (Al), or the like as a main component. The light-shielding thin film is formed so as to be thinner than the resin film 52.

Thereafter, another resin film is coated onto the light-shielding thin film and the resin film 52 by spin coating or the like, and the topmost surface is temporarily made flat. In this state, etching is conducted down to a height such that the light-shielding thin film on the resin film 52 is removed. After that, the remainder of said another resin film is removed. As a result, only the light-shielding thin film on the resin film 52 is removed and the light-shielding film 51 is left intact in a part where the resin film 52 is not formed (region where the light-shielding film 51 is to be formed). The light-shielding film 51 is thinner than the resin film 52, thus forming a recess 51a on the light-shielding film 51.

As for a method of forming the light-shielding film 51 only in parts where the resin film 52 is not formed, as described above, it is possible to use the CMP (chemical mechanical polishing/planarization) method instead. By using this method, the light-shielding film 51 can be formed without increasing the number of process steps by much. However, with this method, it is necessary to coat the light-shielding thin film with a polishing material, and thus, when using a configuration in which a voltage is applied to the light-shielding film 51, it is preferable to use a method such as that described above in which the light-shielding thin film is etched together with another resin film.

Next, the silicon nitride film 53 is formed so as to cover the resin film 52 and the light-shielding film 51. In addition, the silicon oxide film 54 is formed thereon. The silicon nitride film 53 and the silicon oxide film 54 are formed by the CVD method, for example. By forming the silicon nitride film 53 and the silicon oxide film 54 on the resin film 52 and the light-shielding film 51 in this way, the recess 54a corresponding to the light-shielding film 51 can be formed on the silicon oxide film 54. The silicon nitride film 53 and the silicon oxide film 54 may be one layer or many layers. The silicon nitride film 53 and the silicon oxide film 54 correspond to the "another base film."

Next, as shown in FIG. 6b, a silicon thin film 55 (amorphous silicon layer) is formed on the silicon oxide film 54. The silicon thin film 55 is a thin film made of amorphous silicon. As shown in FIG. 6c, a laser beam 40 (white arrows) is radiated onto the silicon thin film 55, thus melting the silicon thin film 55, and changing the silicon thin film into a crystalline silicon thin film 56 (crystalline silicon layer). In this case, the silicon thin film 55 is temporarily melted, and thus, some of the molten silicon is moved into the recess 54a formed on the surface of the silicon oxide film 54. As a result, the silicon thin film 56, which is thicker in the recess 54a than in other parts, is formed as shown in FIG. 6c.

Next, resist patterns are formed so as to cover the part on the silicon thin film 56 where the TFT 60 is to be formed and the part where the photodiode 70 is to be formed, and the silicon thin film 56 is etched using the resist patterns as masks. As a result, the island shaped silicon films 11 and 21, which constitute the TFT and the photodiode respectively, are formed as shown in FIG. 6d. The silicon film 21 is formed of the silicon thin film 56 formed in the recess 54a of the silicon oxide film 54. As a result, the silicon film 21 is thicker than the silicon film 11.

The step of forming the light-shielding film 51, the resin film 52, the silicon nitride film 53, and the silicon oxide film 54 on the substrate 30 corresponds to the base layer forming step, and a step of forming the silicon thin film 55 on the silicon oxide film 54 corresponds to the silicon layer forming step. The step of melting the silicon thin film 55 by the laser beam 40, moving some of the silicon into the recess 54a, and changing the silicon thin film 54 into the silicon thin film 56 corresponds to the melting step.

Also, the steps of forming the resin film 52 on the substrate 30, removing a portion thereof through etching, and thereafter forming the light-shielding film 51 correspond to the first base film forming step, and the step of forming the silicon nitride film 53 and the silicon oxide film 54 on the resin film 52 and the light-shielding film 51 corresponds to the second base film forming step.

In the present embodiment, the light-shielding film 51 was formed after the resin film 52 was formed in FIG. 6a, but the resin film 52 may be formed after the light-shielding film 51. With this configuration, if the resin film 52 is formed of a photocurable resin or the like, then the resin film 52 can be formed in areas other than the light-shielding film 51 using the light-shielding film 51 as the mask. Therefore, a resist pattern is not needed to form the resin film 52. Thus, the manufacturing steps of the semiconductor device 50 can be simplified.

Effects of Embodiment 2

In the present embodiment, the light-shielding film 51 was made to be thinner than the resin film 52, and steps are provided between the light-shielding film 51 and the resin film 52. With this configuration, the silicon film 21 of the photodiode 70 can be made thicker than the silicon film 11 of the TFT 60 without greatly increasing the number of process steps, as in Embodiment 1. Therefore, the performance of the photodiode 70 can be improved.

Also, the thickness of the silicon nitride film 53 and the silicon oxide film 54 are the same both on the side of the TFT 60 and the side of the photodiode 70. Thus, when a laser beam 40 is radiated onto the silicon thin film 55, the heat distribution on the side of the TFT 60 and the side of the photodiode 70 can be made approximately the same. As a result, the entire silicon thin film 55 can be evenly heated when radiating the laser beam 40 thereon. Therefore, according to the above configuration, the crystallization of the silicon can be conducted efficiently over the entire substrate 30.

A recess 51a is formed in the step in which the light-shielding film 51 is formed, and thus, it is possible afterwards to form the silicon nitride film 53, the silicon oxide film 54, and the silicon thin film 55 continuously. As a result, the possibility of dust bonding onto the surface of the semiconductor device 50 during manufacturing can be reduced since it is possible to form the films continuously in the same chamber. Furthermore, the silicon nitride film 53 and the silicon oxide film 54 do not undergo processing, and thus, dust that would occur during processing does not bond to the surface of the silicon oxide film 54 before the silicon thin film 55 is formed. Therefore, according to the present embodiment, defects in the semiconductor device 50 resulting from dust can be prevented.

Embodiment 3

Figure 7:
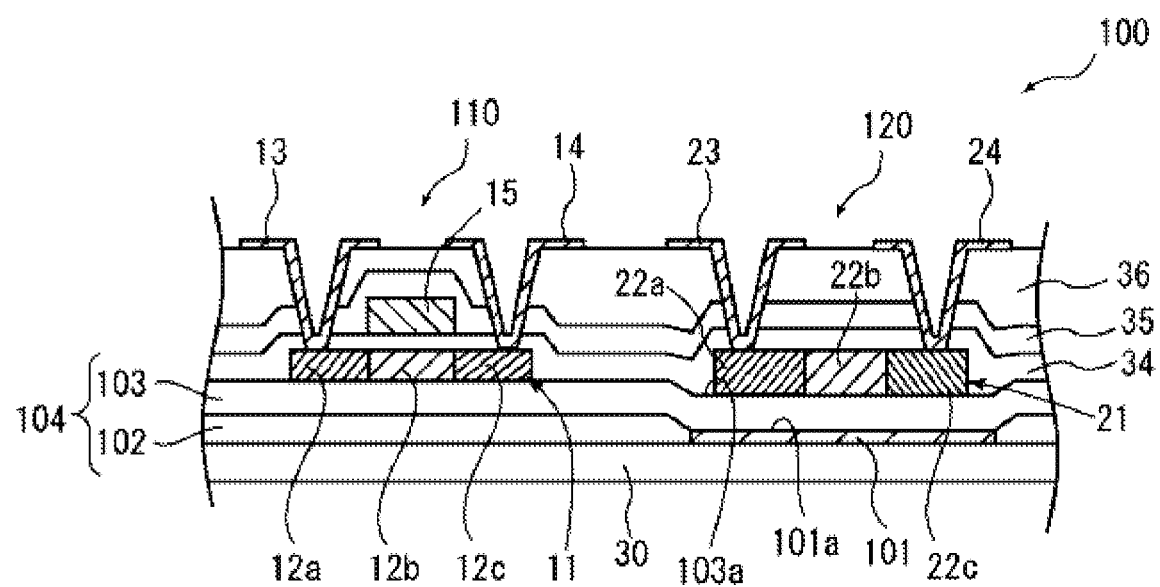
FIG. 7 is a cross-sectional view that shows a schematic configuration of a semiconductor device according to Embodiment 3.

FIG. 7 shows a schematic configuration of a semiconductor device 100 according to Embodiment 3. This embodiment differs from Embodiments 1 and 2 in terms of the configuration of the base layer. In the description below, configurations that are the same as those of Embodiments 1 and 2 are given the same reference characters, and only parts that are different will be described.

Specifically, in this embodiment, a TFT 110 and a photodiode 120 are formed on the same substrate 30. A light-shielding film 101 (light-shielding layer) on the substrate 30 is formed so as to be thinner than a silicon nitride film 102 surrounding the light-shielding film 101. With this configuration, the light-shielding film 101 recedes from the surrounding silicon nitride film 102, forming a recess 101a. By forming a silicon oxide film 103 on the light-shielding film 101 and the silicon nitride film 102, a recess 103a is formed on the surface of the silicon oxide film 103.

Similar to Embodiments 1 and 2, a silicon film formed on the silicon oxide film 103 is temporarily melted by a laser beam, thus allowing a silicon film 21 formed in the recess 103a to be thicker than a silicon film 11 formed in another part.

A base layer 104 is constituted of the silicon nitride film 102 and the silicon oxide film 103. The base layer 104 may alternatively include only one of the silicon nitride film 102 and the silicon oxide film 103, or may include other thin films.

Method for Manufacturing Semiconductor Device

Figure 8:
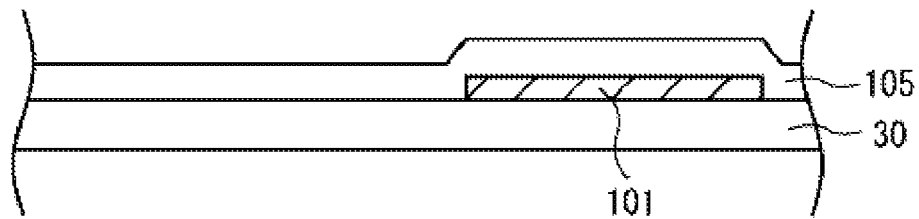
FIG. 8 is a drawing that shows a method for manufacturing the semiconductor device according to Embodiment 3.
Figure 8:
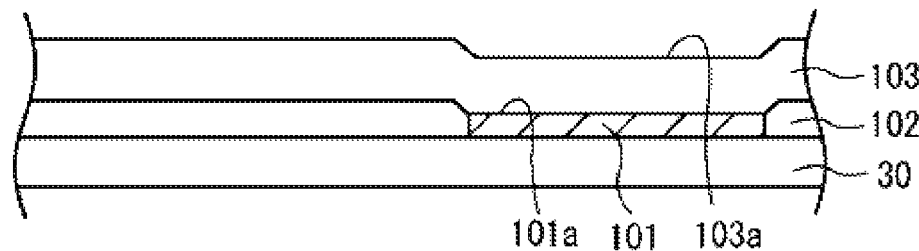
Figure 8:
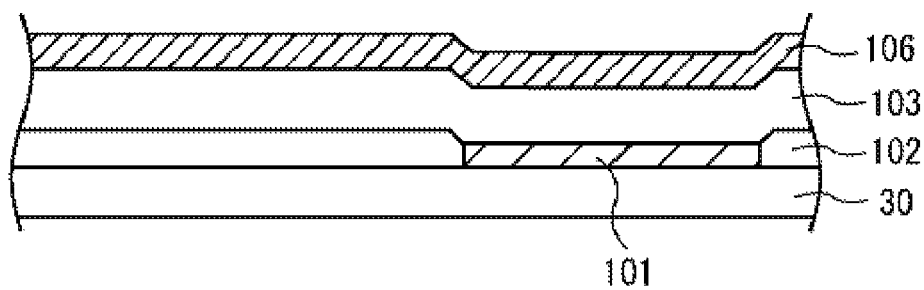
Figure 8:
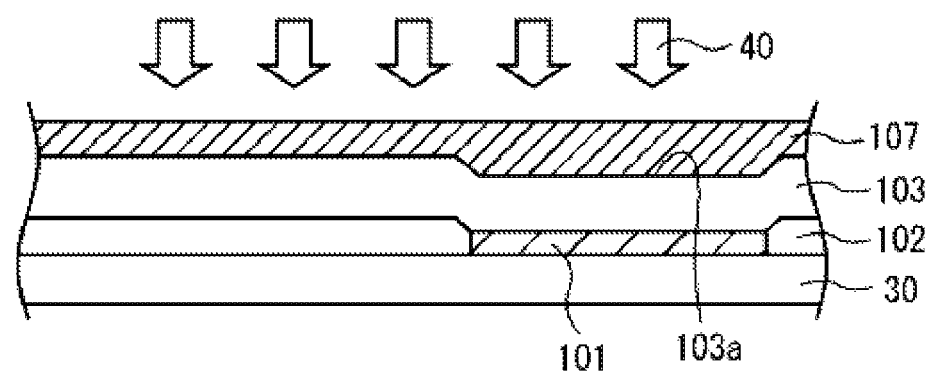
Figure 8:
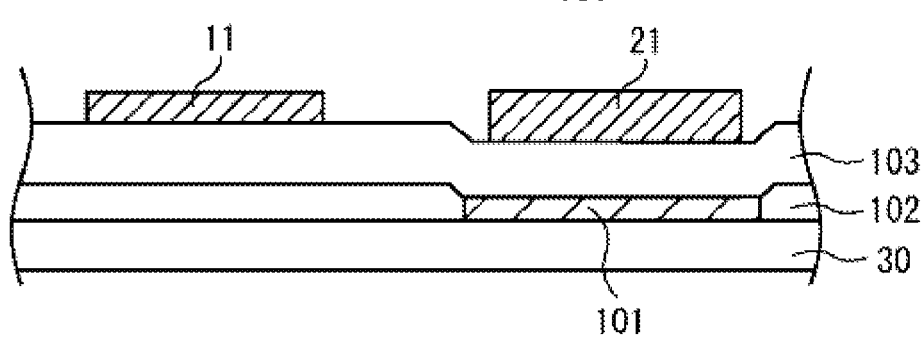

Next, a method for manufacturing the semiconductor device 100 according to the present Embodiment 3 will be described with reference to FIG. 8, only where different from Embodiment 1. FIGS. 8a to 8e show main manufacturing steps up to when the island shaped silicon films 11 and 21 are formed. Steps after FIG. 8e are the same as those of FIG. 4 in Embodiment 1, and thus, descriptions thereof are omitted.

First, as shown in FIG. 8a, a light-shielding film 101 is formed on the substrate 30 so as to prevent illumination light from a backlight device from entering a photodiode from one side (lower side in the drawing) of the substrate 30.

Specifically, a light-shielding thin film is formed by the CVD method, the sputtering method, or the like on one surface (upper surface in the drawing) of the substrate 30. The light-shielding thin film is formed of an insulating film such as a silicon oxide film or a silicon nitride film, or a metallic film with tantalum (Ta), titanium (Ti), tungsten (W), molybdenum (Mo), aluminum (Al), or the like as a main component. Through the photolithography method, a resist pattern is formed in a region where the light-shielding film 101 is to be formed, and using the resist pattern as a mask, the light-shielding thin film is etched. As a result, an island shaped light-shielding film 101 is formed.

Next, a silicon nitride film 105 (first base film) is formed so as to cover the substrate 30 and the light-shielding film 101. The silicon nitride film 105 is formed by the CVD method, for example. Also, the silicon nitride film 105 is formed so as to be thicker than the light-shielding film 101.

After that, a resist pattern is formed by photolithography in areas outside the region where the light-shielding film 101 is formed. To form the resist pattern, the silicon nitride film 105 is coated with the photoresist, and thereafter, light is radiated from the surface of the substrate 30 opposite to the surface where the light-shielding film 101 is formed (hereinafter referred to as the main surface), using the light-shielding film 101 as a mask. The silicon nitride film 105 on the light-shielding film 101 is etched using the resist pattern as a mask. As a result, the silicon nitride film 102 is formed so as to surround the light-shielding film 101, as shown in FIG. 8b. The light-shielding film 101 is thinner than the silicon nitride film 102, resulting in a recess 101a being formed in the part where the light-shielding film 101 is formed.

As shown in FIG. 8b, a silicon oxide film 103 (second base film) is formed on the light-shielding film 101 and the silicon nitride film 102. The silicon oxide film 103 is formed by the CVD method, for example. By forming the silicon oxide film 103 on the light-shielding film 101 and the silicon nitride film 102 in this way, a recess 103a is formed on the silicon oxide film 103 so as to correspond to the light-shielding film 101. The silicon oxide film 103 may be constituted of one layer or many layers.

Next, as shown in FIG. 8c, a silicon thin film 106 (amorphous silicon layer) is formed on the silicon oxide film 103. The silicon thin film 106 is formed of amorphous silicon. By radiating a laser beam 40 (white arrows) onto the silicon thin film 106 as shown in FIG. 8d, the silicon thin film 106 is melted and changes to a crystalline silicon thin film 107 (crystalline silicon layer). At this time, the silicon thin film 106 is temporarily melted, and thus, some of the molten silicon moves into the recess 103a formed on the surface of the silicon oxide film 103. As a result, the silicon thin film 107 is formed so as to be thicker in the recess 103a than in other parts, as shown in FIG. 8d.

Next, resist patterns are formed so as to cover the region where the TFT 110 is to be formed and the region where the photodiode 120 is to be formed, on the silicon thin film 107, and the silicon thin film 107 is etched with the resist patterns as masks. With this configuration, island shaped silicon films 11 and 21 that respectively constitute the TFT 110 and the photodiode 120 are formed, as shown in FIG. 8e. The silicon film 21 is formed of the silicon thin film 107 formed in the recess 103a of the silicon oxide film 103. As a result, the silicon film 21 is thicker than the silicon film 11.

The step of forming the light-shielding film 101, the silicon nitride film 102, and the silicon oxide film 103 on the substrate 30 corresponds to the base layer forming step, and the step of forming the silicon thin film 106 on the silicon oxide film 103 corresponds to the silicon layer forming step. Also, the step of melting the silicon thin film 106 by the laser beam 40 so as to move some of the silicon into the recess 103a, and changing the silicon thin film 106 to the silicon thin film 107 corresponds to the melting step, and the step of forming the silicon films 11 and 21 corresponds to the semiconductor layer forming step.

The step of forming the silicon nitride film 105 on the substrate 30 and the light-shielding film 101 corresponds to the base layer forming step, and the step of forming a resist pattern on the silicon nitride film 105 corresponds to the pattern forming step. The step of removing the silicon nitride film 105 on the light-shielding film 101 through etching using the resist pattern so as to form the silicon oxide film 103 having the recess 103a corresponds to the recess forming step.

Effects of Embodiment 3

In the present embodiment, the light-shielding film 101 is made thinner than the silicon nitride film 102, and steps are provided between the light-shielding film 101 and the silicon nitride film 102. With this configuration, it is possible to make the silicon film 21 of the photodiode 120 thicker than the silicon film 11 of the TFT 110 without greatly increasing the number of process steps, as in Embodiments 1 and 2. Thus, the performance of the photodiode 120 can be improved.

In the present embodiment, when etching the silicon nitride film 105, the resist pattern was formed on the silicon nitride film 105 by radiating light from the side opposite to the main surface of the substrate 30, using the light-shielding film 101 as a mask. As a result, it is possible for the region of the silicon nitride film 105 corresponding to the light-shielding film 101 to be etched with ease.

The thickness of the silicon oxide film 103 is the same both on the side of the TFT 110 and the side of the photodiode 120. Thus, when the silicon thin film 106 is radiated with the laser beam 40, the distribution of heat on the side of the TFT 110 and on the side of the photodiode 120 can be made approximately the same. As a result, when the silicon thin film 106 is radiated with the laser beam 40, the entire silicon thin film 106 can be heated evenly. Therefore, according to the above configuration, the crystallization of the silicon can be conducted efficiently over the entire substrate 30.

Other Embodiments

Embodiments of the present invention have been described above, but the above embodiments are mere examples of implementations of the present invention. The present invention is not limited to the above embodiments, and can be implemented by appropriately modifying the above embodiments without departing from the spirit thereof.

In each of the aforementioned embodiments, the display panel 2 of a liquid crystal display device was given as an example of where to apply the semiconductor devices 1, 50, and 100, but the present invention is not limited thereto. As long as a TFT and a photodiode are formed on the same substrate, the present invention may be applied to any type of device.

In each of the aforementioned embodiments, the topmost surface of the semiconductor devices 1, 50, and 100 is the silicon oxide film 36. However, a protective film may be provided on the silicon oxide film 36 so as to cover the TFT 10 and the photodiode 20 after the step shown in FIG. 4d.

In each of the aforementioned embodiments, a base film is formed by combining a few different types of films including a silicon nitride film, a silicon oxide film, and a resin film. However, other combinations of films not limited to those of the aforementioned embodiments may be used, or other types of films may be combined to form the base film, as long as they function as a base film.

In Embodiments 1 and 3, a resist pattern used in forming the recess by etching is formed by using the light-shielding film as a mask, but the present invention is not limited thereto. A mask member different from the light-shielding film may be used in forming the resist pattern.

In Embodiment 1, etching is conducted so as to leave a portion of the silicon oxide film (reference character 33a) above the light-shielding film 37, but the present invention is not limited thereto. Etching may also be conducted so as to remove all of the silicon oxide film above the light-shielding film 37.

In Embodiment 3, the silicon nitride film 102 on the light-shielding film 101 is completely removed. However, the silicon nitride film 102 may be left on the light-shielding film 101.

INDUSTRIAL APPLICABILITY

The semiconductor device according to the present invention is applicable as a semiconductor device in which a TFT and a photodiode are formed on the same substrate.

The invention claimed is:

1. A method for manufacturing a semiconductor device, comprising:
   a base layer forming step of forming a base layer on a substrate, the base layer having a recess on a surface thereof;
   a silicon layer forming step of forming an amorphous silicon layer on the base layer;
   a melting step of melting the amorphous silicon layer to form a crystalline silicon layer while moving molten silicon into the recess; and
   a semiconductor layer forming step of forming, of the crystalline silicon layer, a first semiconductor layer that constitutes a portion of a thin film transistor and a second semiconductor layer that constitutes a portion of a photodiode, the first semiconductor layer being formed of the silicon layer located in a part other than the recess, the second semiconductor layer being formed of the silicon layer located in the recess, the second semiconductor layer being thicker than the first semiconductor layer,
   wherein the method further comprises a step of forming an island shaped light-shielding layer on the substrate,
   wherein, in the base layer forming step, the base layer is formed on the substrate and the light-shielding layer such that the recess is located above the light-shielding layer,
   wherein the substrate is a transparent substrate,
   wherein the base layer comprises a plurality of base films, and
   wherein the base layer forming step includes:
      a base layer depositing step of forming a first base film that is thicker than the light-shielding layer on the substrate and on the light-shielding layer;
      a pattern forming step of radiating light from a side opposite to a laminating direction of the substrate, using the light-shielding layer as a mask, to form a resist pattern on the first base film; and
      a recess forming step of removing the first base film on the light-shielding layer using the resist pattern as a mask, and thereafter forming a second base film on the light-shielding layer and the first base film to form the recess on the second base film.

2. A semiconductor device comprising:
   a substrate;
   a base layer formed on the substrate so as to have a recess on a surface thereof;
   a first semiconductor layer formed outside the recess of the base layer;
   a second semiconductor layer formed in the recess so as to be thicker than the first semiconductor layer; and
   a light-shielding layer formed on the substrate between the substrate and the second semiconductor layer,
   wherein the first semiconductor layer constitutes a portion of a thin film transistor,
   wherein the second semiconductor layer constitutes a portion of a photodiode,
   wherein the base layer comprises a first base film formed so as to surround the light-shielding layer on the substrate, and
   wherein the light-shielding layer is thinner than the first base film.

3. The semiconductor device according to claim 2, wherein the first semiconductor layer and the second semiconductor layer are formed so as to have thicknesses that allow respective surfaces thereof opposite to the substrate to be at substantially the same height from the substrate.

4. A method for manufacturing a semiconductor device, comprising:
   forming a substrate;
   forming a base layer on the substrate so as to have a recess on a surface thereof;
   forming a first semiconductor layer formed outside the recess of the base layer;
   forming a second semiconductor layer formed in the recess so as to be thicker than the first semiconductor layer; and
   forming a light-shielding layer formed on the substrate between the substrate and the second semiconductor layer,
   wherein the first semiconductor layer constitutes a portion of a thin film transistor,
   wherein the second semiconductor layer constitutes a portion of a photodiode,
   wherein the base layer comprises a first base film formed so as to surround the light-shielding layer on the substrate, and
   wherein the light-shielding layer is thinner than the first base film.

* * * * *